(12) United States Patent
Whetsel

(10) Patent No.: US 6,499,070 B1
(45) Date of Patent: Dec. 24, 2002

(54) CIRCUITRY AND METHOD OF TRANSFERRING PARALLEL AND SERIAL DATA

(75) Inventor: Lee D. Whetsel, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/326,292

(22) Filed: Jun. 7, 1999

Related U.S. Application Data

(60) Provisional application No. 60/088,429, filed on Jun. 8, 1998.

(51) Int. Cl.[7] ............................................... G06F 13/12
(52) U.S. Cl. ......................................... 710/71; 710/305
(58) Field of Search ................... 710/71, 305; 341/100, 341/101; 365/219; 377/69

(56) References Cited

U.S. PATENT DOCUMENTS

| | | | | |
|---|---|---|---|---|
| 5,086,388 A | * | 2/1992 | Matoba et al. | 395/425 |
| 5,596,724 A | * | 1/1997 | Mullins et al. | 395/250 |
| 5,649,124 A | * | 7/1997 | Kreidl | 395/306 |
| 5,758,127 A | * | 5/1998 | Macaulay et al. | 395/500 |
| 5,799,211 A | * | 8/1998 | Hakkarainen et al. | 395/891 |

* cited by examiner

*Primary Examiner*—Jeffrey Gaffin
*Assistant Examiner*—Harold Kim
(74) *Attorney, Agent, or Firm*—Yingsheng Tung; Wade James Brady III; Frederick J. Telecky Jr.

(57) ABSTRACT

A serial and parallel data communication system utilizing a data forwarding element and a data forwarding multiplexer; providing a method of data conversion having an overlap in the operation of parallel and serial I/O modes. The present invention thus enables continuous and simultaneous serial to parallel and parallel to serial conversion.

3 Claims, 11 Drawing Sheets

CIRCUITRY AND METHOD OF TRANSFERRING PARALLEL AND SERIAL DATA

This application claims priority under 35 USC § 119 (e)(1) of Provisional Application No. 60/088,429, filed Jun. 8, 1998.

FIELD OF INVENTION

This invention generally relates to data communication, and more specifically to the efficient conversion between parallel and serial data communication, and conversion between serial and parallel data communication.

BACKGROUND OF THE INVENTION

Data communication requiring conversion between serial and parallel data formats, and circuits performing that conversion, are used extensively in modern electronics. Conventional methods of conversion require that a circuit operate in two modes: a first mode in which the circuit receives data in serial bit form and outputs data in parallel bit form; and a second mode whereby the circuit receives data in parallel bit form and outputs data in serial bit form. While the first and second modes can operate concurrently, there is a time when the serial input of the first mode must be suspended to allow for the parallel input of the second mode.

Conventional conversion designs often employ a serial input/parallel output, parallel input/serial output N-bit register. The register receives mode and control input which regulates its operation. In operation, the register receives mode and control input to simultaneously load N data bits from the parallel inputs, then sequentially shift each of the data bits out via the serial output (parallel input/serial output mode). While shifting out the N parallel data bits on the serial output, the register shifts in N serial data bits from the serial input to be output on the parallel data outputs. During a parallel load operation, the N register bits are configured by the mode and control input to accept data from the parallel data inputs. Consequently, during a parallel load operation the first bit of the register is not available to load serial data (that will eventually be supplied to the $N^{th}$ parallel output) from the serial input. Thus, serial operations cannot occur during parallel load operations and must be suspended.

It is therefore desirable to provide a method of serial and parallel data communication that overcomes the aforementioned limitation of the prior art.

The present invention provides a method of data conversion having an overlap in the operation of parallel and serial I/O (input/output) modes that improves upon the results obtained with the prior art previously described.

DETAILED DESCRIPTION

Figure 1:
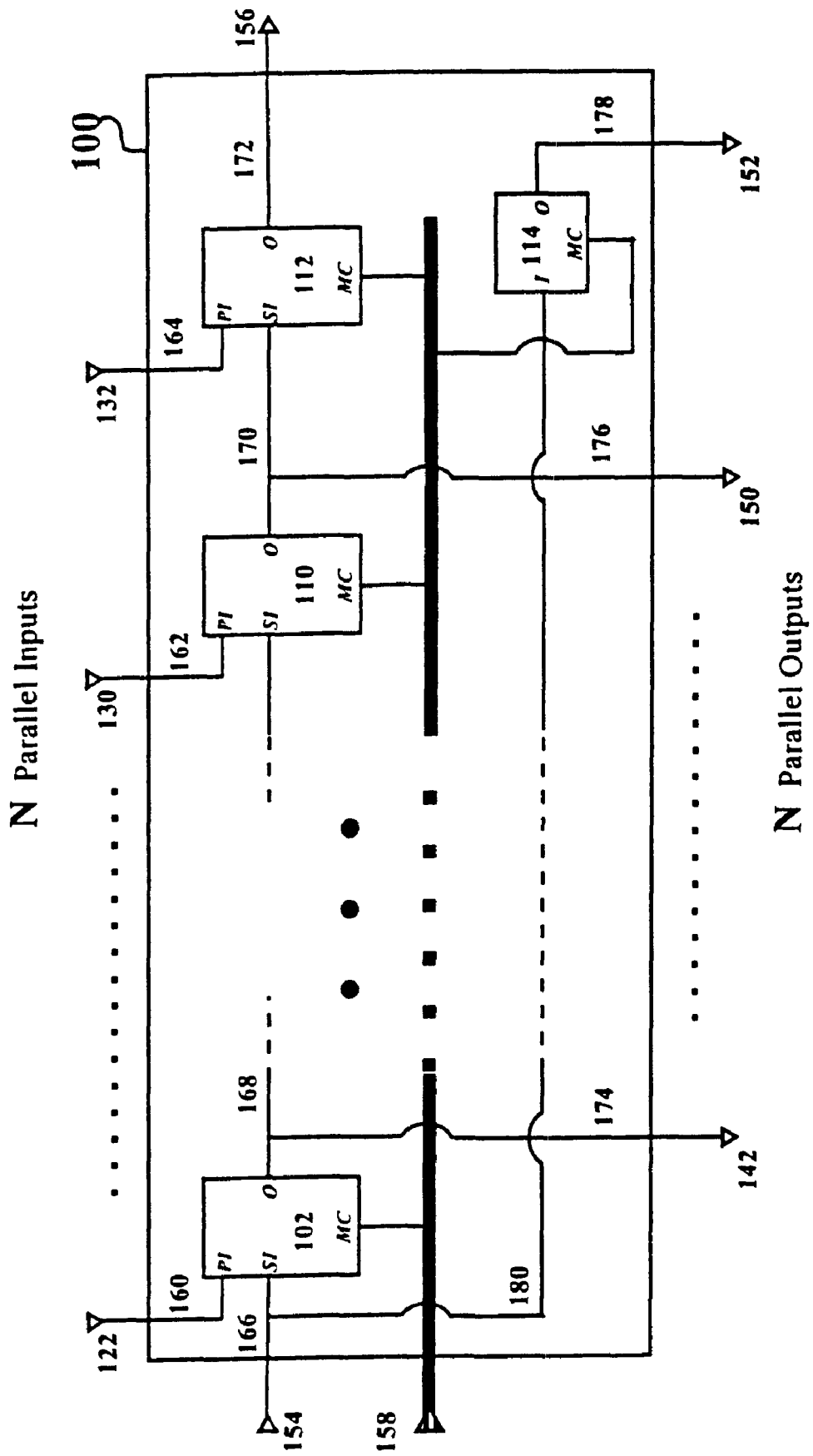
FIG. 1 illustrates a serial/parallel register according to the present invention.

FIG. 1 depicts a serial/parallel data conversion register 100 comprising an array of data storage elements 102–112, configured as an N bit shift register. Data forwarding element 114 provides a data forwarding structure for this embodiment of the invention. In the preferred embodiment, data forwarding element 114 is a flip-flop; though any suitable storage element (e.g. latch or RAM cell) known in the art may be employed. Conversion register 100 is configured, per the present invention, to function as a continuous serial/parallel data converter.

Register 100 has: N parallel inputs 122–132, N parallel outputs 142–152, a serial input 154, a serial output 156, and a mode and control input 158, herein depicted as a bus. Each of these inputs and outputs extend out from register 100 and communicably connect to external circuits and systems.

In the preferred embodiment, mode and control input 158 is a bus. Depending on particular configuration of a design, and the storage elements employed therein, mode and control input may consist of one or more individual lines or busses.

Additionally, register 100 has: lead 160 coupling a parallel input of element 102 to input 122; leads 162 and 164 similarly and respectively coupling parallel inputs of elements 110 and 112 to inputs 130 and 132; and lead 166 coupling a serial input of element 102 to input 154. Lead 168 couples an output of element 102 to a serial input of a subsequent data storage element. Lead 170 couples an output of element 110 to a serial input of element 112; and lead 172 couples an output of element 112 to output 156. Elements 102–112 each have a mode and control input coupled to bus 158.

Lead 174 couples lead 168 to output 142. Each subsequent data storage element, except for the last element 112, has an output lead coupled to a corresponding register parallel output; as lead 176 couples lead 170 to output 150.

Forwarding element 114 has: an input coupled to lead 166 by lead 180; a mode and control input coupled to bus 158; and an output coupled to output 152 by lead 178.

Figure 2:
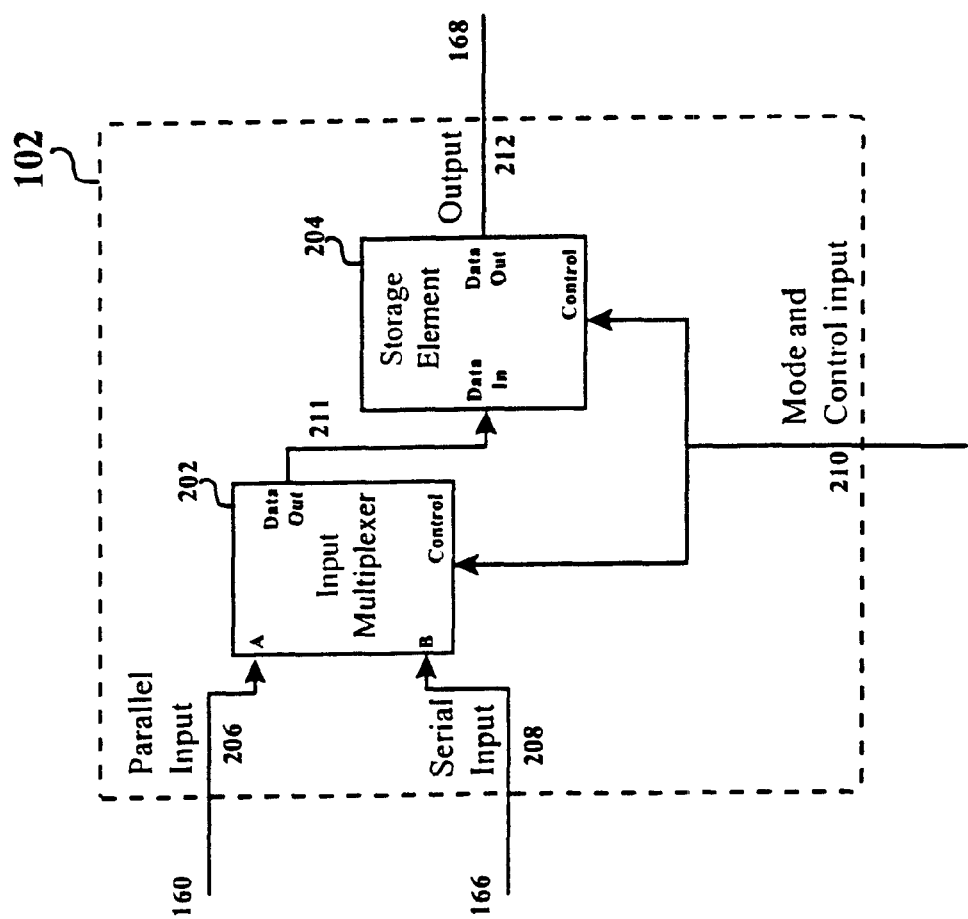
FIG. 2 illustrates a storage element according to the present invention.

A preferred embodiment of the data storage elements is illustrated in FIG. 2. Data storage element 102 is depicted as an example. Element 102 has: input multiplexer 202, storage element 204, parallel input 206, serial input 208, mode and control input 210, and output 212.

Input 206 connects to lead 160, input 208 connects to lead 166, input 210 connects to bus 158 of FIG. 1, and output 212 connects to lead 168.

Multiplexer 202 has a parallel data input A and a serial input B, a control input Control, and a data output Data Out.

Storage element 204 has a data input Data In, control input Control, and data output Data Out.

Lead 211 couples the data output of multiplexer 202 to the data input of element 204. Inputs A and B of multiplexer 202 coupled to inputs 206 and 208, respectively. The Data Out output of element 204 couples to output 212.

The control inputs of multiplexer 202 and element 204 couple to mode and control input 210; and both multiplexer 202 and element 204 are responsive to input 210 via their respective control inputs.

As data is presented via inputs 206 and 208 to inputs A and B, input multiplexer 202 responds to control input 210, transmitting data from either input A or B to element 204. Data is loaded into element 204 and shifted out of element 204, to output 212, responsive to control input 210.

Input multiplexer 202 may be implemented using any suitable contrivance such as combinational logic circuits, tri-state circuits, or transmission gate circuits. In the preferred embodiment, each input multiplexer is structurally separate from its corresponding storage element. It may be desirable, however, to incorporate the input multiplexer structure within the storage element structure. All such possibilities are comprehended by the present invention.

In the preferred embodiment, storage element 204 is a flip-flop; although any suitable storage element such as a FIFO, latch, or memory cell may be employed depending on desired operational characteristics.

Figure 3:
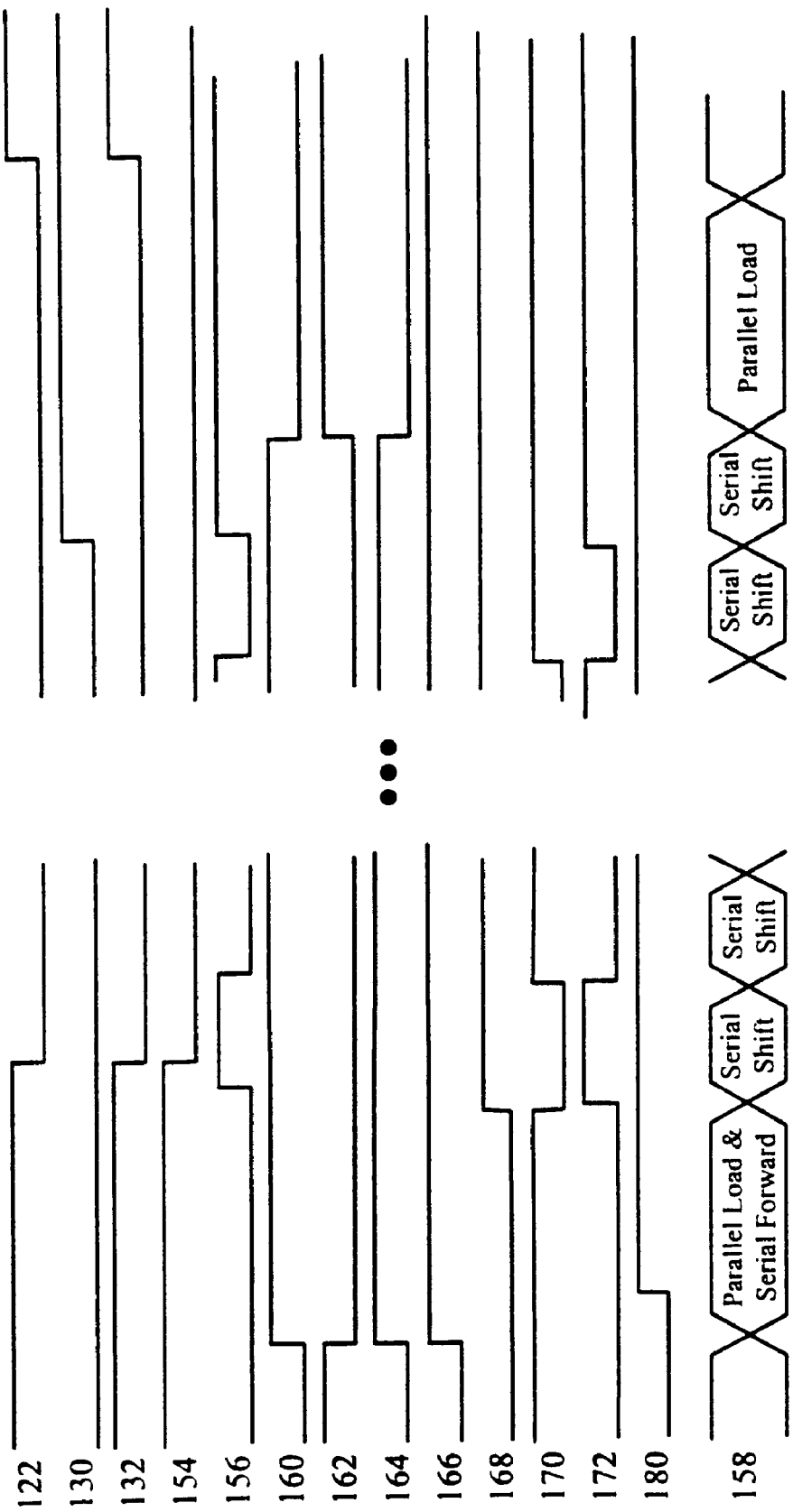
FIG. 3 illustrates a mode of operation of the register of FIG. 1.
Figure 4:
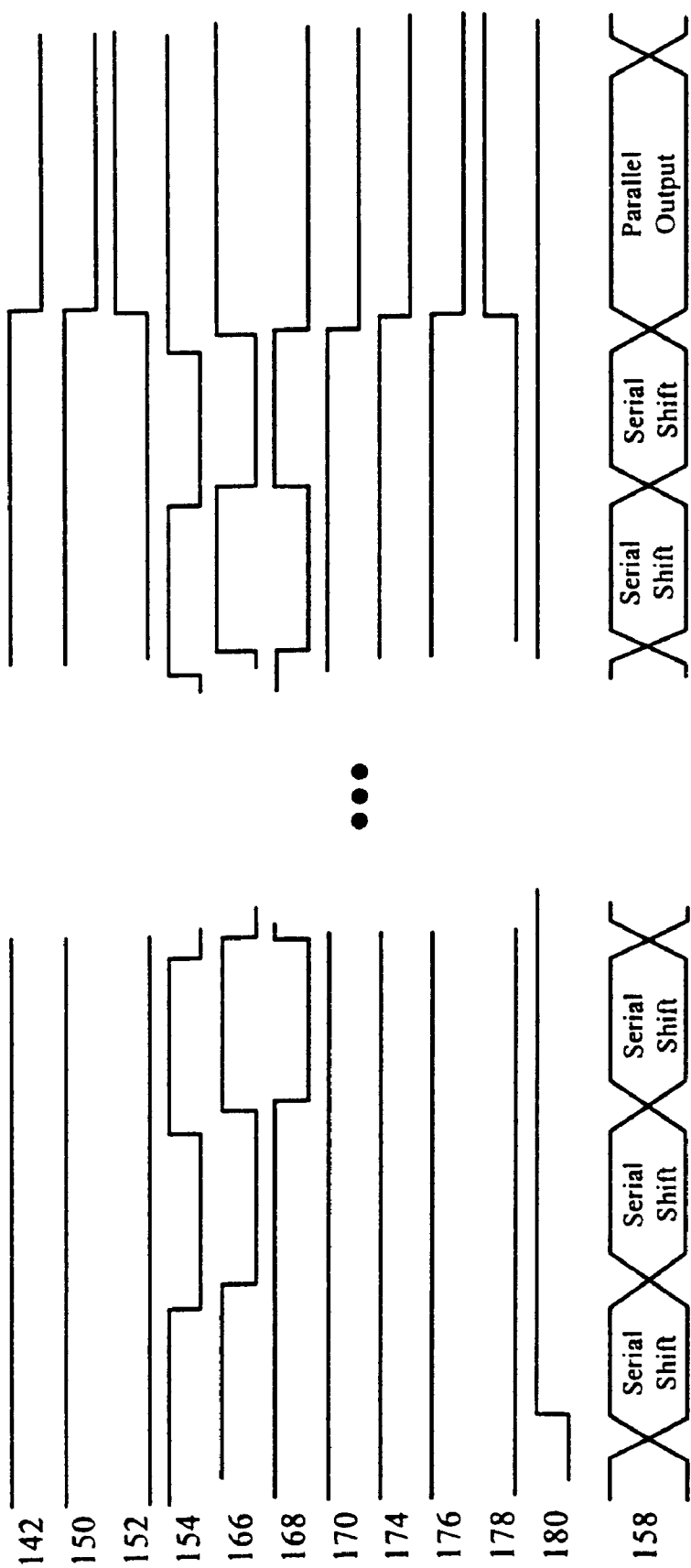
FIG. 4 illustrates another mode of operation of the register of FIG. 1.
Figure 5:
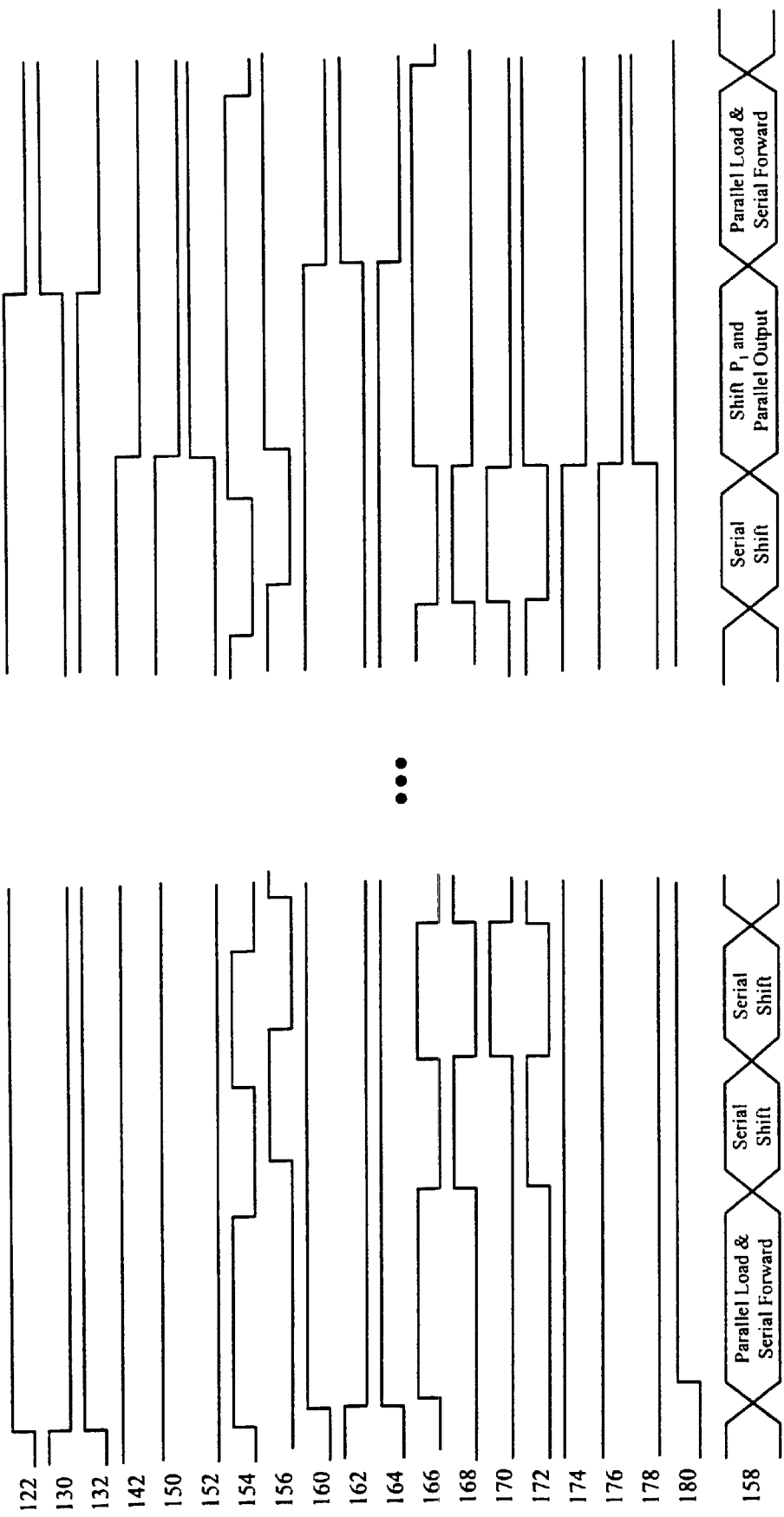
FIG. 5 illustrates another mode of operation of the register of FIG. 1.

FIGS. 3 through 5 are representative timing diagrams for the operation of conversion register 100 as presented in FIG. 1. Register 100 converts serial and parallel data in three modes of operation: Parallel In—Serial Out (PISO), Serial In—Parallel Out (SIPO), and Continuous Serial/Parallel In—Out (CSPIO). Control bus 158 signals operation in and transition between SIPO, PISO, and CSPIO modes.

FIG. 3 depicts operation in, or transition to, PISO mode. Inputs 122–132 and 154 present data as bus 158 signals a parallel load and serial forward. As the parallel load initiates, leads 160–164 forward parallel data from inputs 122–132 into elements 102–122, respectively. Concurrently the serial forward initiates, and lead 166 transmits the first serial data bit from input 154 to lead 180 which transfers that serial data bit into element 114. This first serial data bit remains in element 114 until needed upon transition to either SIPO or CSPIO mode. Bus 158 signals a serial shift wherein the N data bits, previously loaded in parallel, shift serially through elements 102–112. Lead 168 transfers the data from element 102 to its subsequent data storage element; lead 170 transfers data from element 110 to element 112; and lead 172 transfers the $N^{th}$ data bit from element 112 to output 156. Operation continues in this manner until the first parallel data bit, previously loaded into element 102, shifts from element 112 to output 156 via lead 172. Assuming that register 100 remains in PISO mode, bus 158 signals a parallel load operation, another N data bits load into elements 102–112, and operation continues as previously described.

FIG. 4 depicts operation in, or transition to, SIPO mode. Input 154 presents data as bus 158 signals a serial shift. If a first serial data bit has not previously been forwarded to element 114, lead 166 transmits a first data bit from input 154 and lead 180 forwards that first data bit to element 114. Bus 158 signals another serial shift; and lead 166 transmits a second data bit from input 154 to element 102. Subsequently, bus 158 continues signaling serial shifts wherein (N–1) data bits shift serially into elements 102 110. Element 114 already stores the first ($N^{th}$) data bit. Once elements 102–110 are filled with data, bus 158 signals a parallel output operation. As a parallel output operation is signaled, leads 168–170 transmit the (N–1) data bits from elements 102–110 to outputs 142–150 via leads 174–176, respectively. Concurrently, lead 178 transmits the ($N^{th}$) data bit from element 114 to output 152. Assuming that register 100 remains in SIPO mode, bus 158 begins signaling serial shifts again, and operation continues as previously described.

Transition from PISO to SIPO mode may be expedited by shifting (N–1) serial data bits into data elements 102–110 as previously loaded parallel data bits shift out. This operation effectively overlaps the serial shifts of the PISO and SIPO modes as represented in FIGS. 3 and 4, respectively.

Full and continuous operation of this type, providing continuous PISO and SIPO mode operations simultaneously (CSPIO mode), is depicted in FIG. 5. Inputs 122–132 and 154 present data as bus 158 signals a parallel load and serial forward. As the parallel load initiates, leads 160–164 forward parallel data from inputs 122–132 into elements 102–112, respectively. Concurrently the serial forward initiates, and if a first serial data bit has not previously been forwarded to element 114, lead 166 transmits the first serial data bit from input 154 to lead 180 which transfers that serial data bit into element 114. Bus 158 signals a serial shift wherein the N data bits previously loaded in parallel shift serially through elements 102–112 as serial data bits shift into and through each storage element following the parallel data bits. Lead 168 transfers the data from element 102 to its subsequent data storage element as lead 166 shifts the second serial bit from input 154 into element 102. Lead 170 transfers data from element 110 to element 112 and lead 172 transmits the $N^{th}$ parallel data bit from element 112 to output 156. Operation continues in this manner until the first parallel data bit, previously loaded into element 102, shifts from element 110 to element 112 via lead 170.

At this point in operation element 112 stores the first parallel data bit; element 114 stores the first ($N^{th}$) serial data bit; and elements 110–102 store the second through N–1 serial data bits, respectively.

Bus 158 signals a final shift of the first parallel bit ($P_1$) concurrent with a parallel output operation. The first parallel bit shifts from element 112 to output 156 via lead 172 as leads 168–170 transmit the data bits from elements 102–110 to outputs 142–150 via leads 174–176, respectively, and lead 178 transmits the data bit from element 114 to output 152. Assuming that register 100 remains in CSPIO mode, bus 158 again signals a parallel load and serial forward, and operation continues as previously described.

Employment of the data forwarding element thus achieves an overlap in serial and parallel operations; providing continuous and concurrent serial to parallel and parallel to serial conversion.

Figure 6:
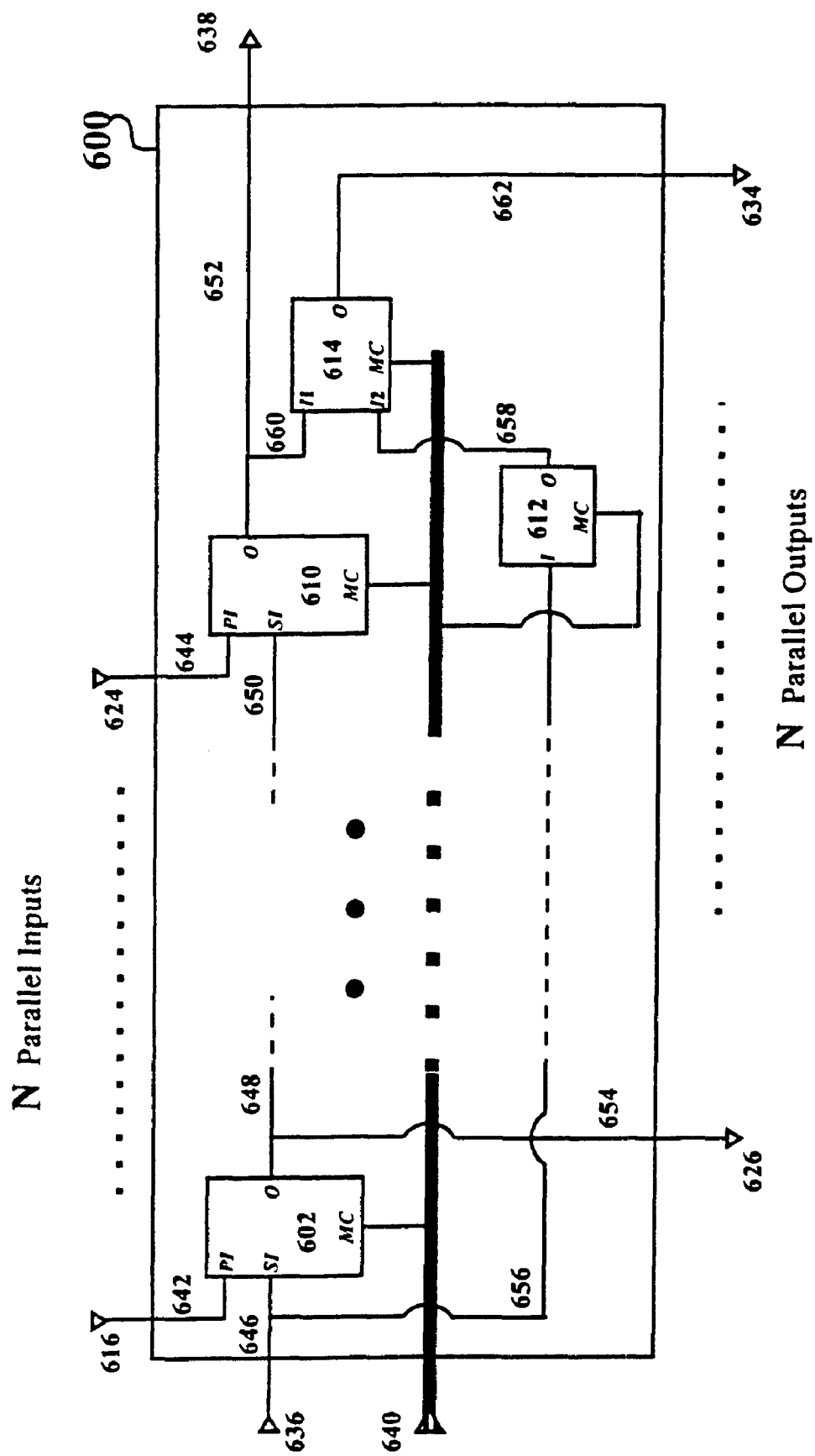
FIG. 6 illustrates another serial/parallel register according to the present invention.

FIG. 6 depicts a serial/parallel data conversion register 600 comprising an array of data storage elements 602–610, configured as an N bit shift register. Data forwarding element 612 and data forwarding multiplexer 614 provide a data forwarding structure for this embodiment of the invention. In the preferred embodiment, data forwarding element 612 is a flip-flop; though any suitable storage element (e.g. latch or RAM cell) known in the art may be employed. Data forwarding multiplexer 614 is implemented using any suitable contrivance such as combinational logic circuits, tri-state circuits, or transmission gate circuits. All such possibilities are comprehended by the present invention. Data storage elements 602–610 are similar to data storage element 102 of FIG. 2.

Conversion register 600 is primarily designed to function as a continuous serial/parallel data converter. However, conversion register 600 may alternatively be employed as a parallel I/O register, or combined in an array as a multifunction port multiplexer. These and other related functions are enabled by five distinct modes of operation provided by the present invention. All such functions are comprehended by the present invention.

Register 600 has: N parallel inputs 616–624, N parallel outputs 626–634, a serial input 636, a serial output 638, and a mode and control input 640, herein depicted as a bus. Each of these inputs and outputs extend out from register 600 and communicably connect to external circuits and systems.

In the preferred embodiment, mode and control input 640 is a bus. Depending on particular configuration of a design, and the storage elements employed therein, mode and control input may consist of one or more individual lines or busses. Additionally, register 600 has: lead 642 coupling a parallel input of element 602 to input 616; lead 644 coupling a parallel input of element 610 to input 624; and lead 646 coupling a serial input of element 602 to input 636. Lead 648 couples an output of element 602 to a serial input of a subsequent data storage element. Lead 650 couples an output of a preceding storage element to a serial input of element 610; and lead 652 couples an output of element 610 to output 638. Elements 602–610 each have a mode and control input coupled to bus 640.

Lead 654 couples lead 648 to output 626. Each subsequent data storage element, except for last element 610, has an output lead coupled to a corresponding register parallel output.

Forwarding element 612 has: an input coupled to lead 646 by lead 656; a mode and control input coupled to bus 640; and an output coupled to multiplexer 614 by lead 658. Forwarding multiplexer 614 has: an input coupled to lead 652 by lead 660; an input coupled to element 612 by lead 658; and an output coupled to output 634 by lead 662.

FIGS. 7 through 11 are representative timing diagrams for the operation of conversion register 600 as presented in FIG. 6. Register 600 transfers serial and parallel data in five modes of operation: Parallel In—Serial Out (PISO); Serial In—Parallel Out (SIPO); Parallel In—Parallel Out (PIPO); Serial In—Serial Out (SISO); and Continuous Serial/Parallel In—Out (CSPIO). Control bus 640 initiates operation in and transition between all modes.

Figure 7:
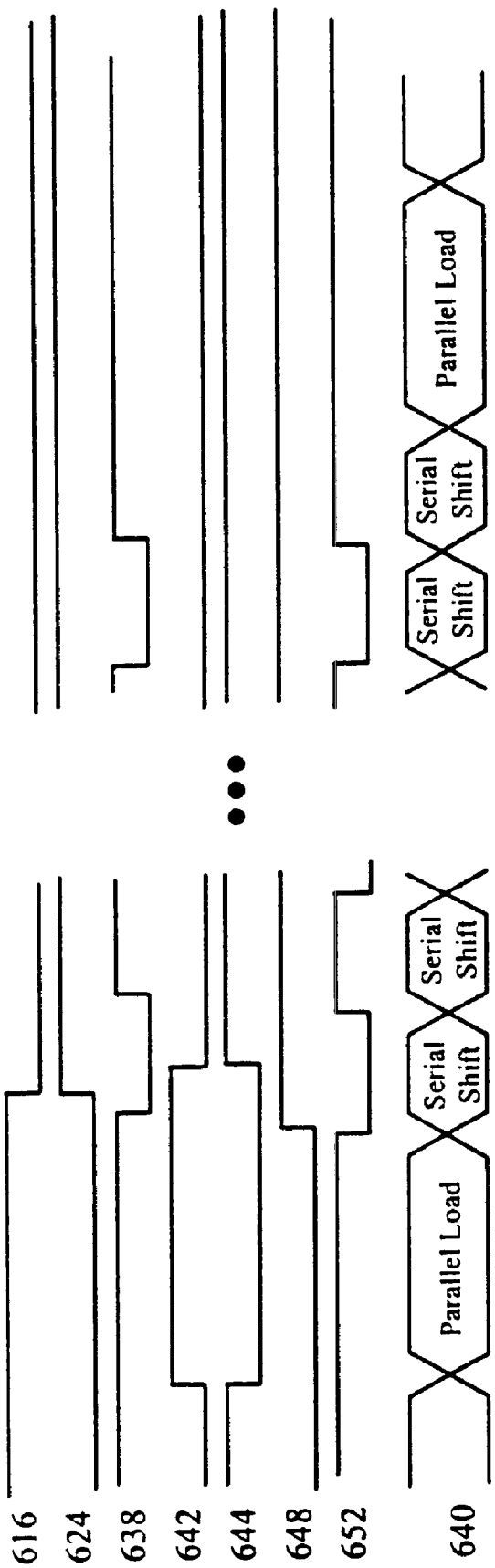
FIG. 7 illustrates a mode of operation of the register of FIG. 6.

FIG. 7 depicts operation in, or transition to, PISO mode. Inputs 616–624 present data as bus 640 signals a parallel load. As the parallel load initiates, leads 642–644 transmit parallel data from inputs 616–624 into elements 602–610, respectively. Bus 640 signals a serial shift wherein the N data bits, previously loaded in parallel, shift serially through elements 602–610. Lead 648 transfers the data from element 602 to its subsequent data storage element and lead 652 transfers the $N^{th}$ data bit from element 610 to output 638. Bus 640 signals serial shifts and operation continues in this manner until the first parallel data bit, previously loaded into element 602, shifts from element 610 to output 638 via lead 652. Assuming that register 600 remains in PISO mode, bus 640 signals another parallel load operation, another N data bits load into elements 602–610, and operation continues as previously described.

Figure 8:
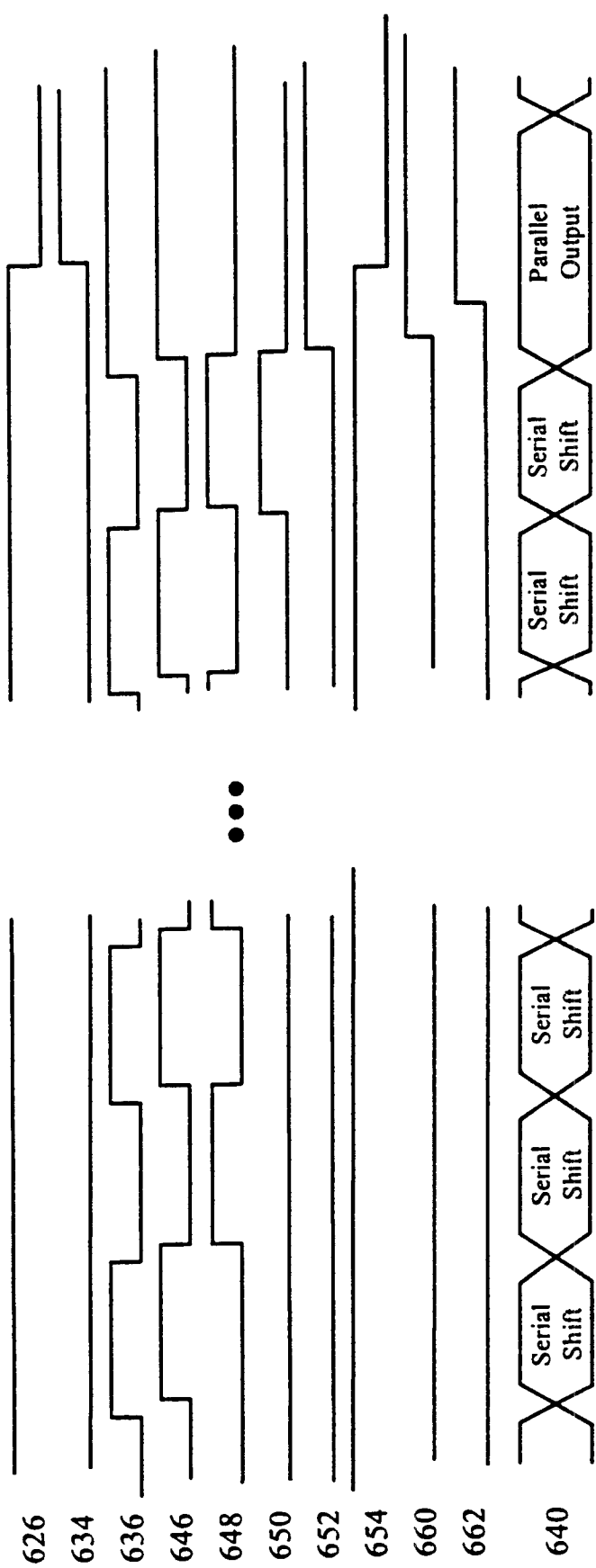
FIG. 8 illustrates another mode of operation of the register of FIG. 6.

FIG. 8 depicts operation in, or transition to, SIPO mode. Bus 640 signals a serial shift operation, wherein lead 646 transfers the first serial data bit present on input 636 into element 602. Bus 640 again signals a serial shift, and storage element 602 shifts the first serial bit out to its subsequent storage element via lead 648, while transfering the next serial data bit from input 636 via lead 646. Serial data continues shifting through the data storage elements in similar fashion until the first serial data bit shifts into element 610 via lead 650. Bus 640 signals a parallel output initiating simultaneous output of the data previously loaded serially to the parallel outputs 626–634. Lead 654 transmits data output from element 602 (via lead 648) to output 626. Lead 660 transmits data output from element 610 (via lead 652) to multiplexer 614; which in turn transmits that data to output 634 via lead 662. For continued operation in SIPO mode, control bus 640 again signals a serial shift operation and the register functions as described.

Figure 9:
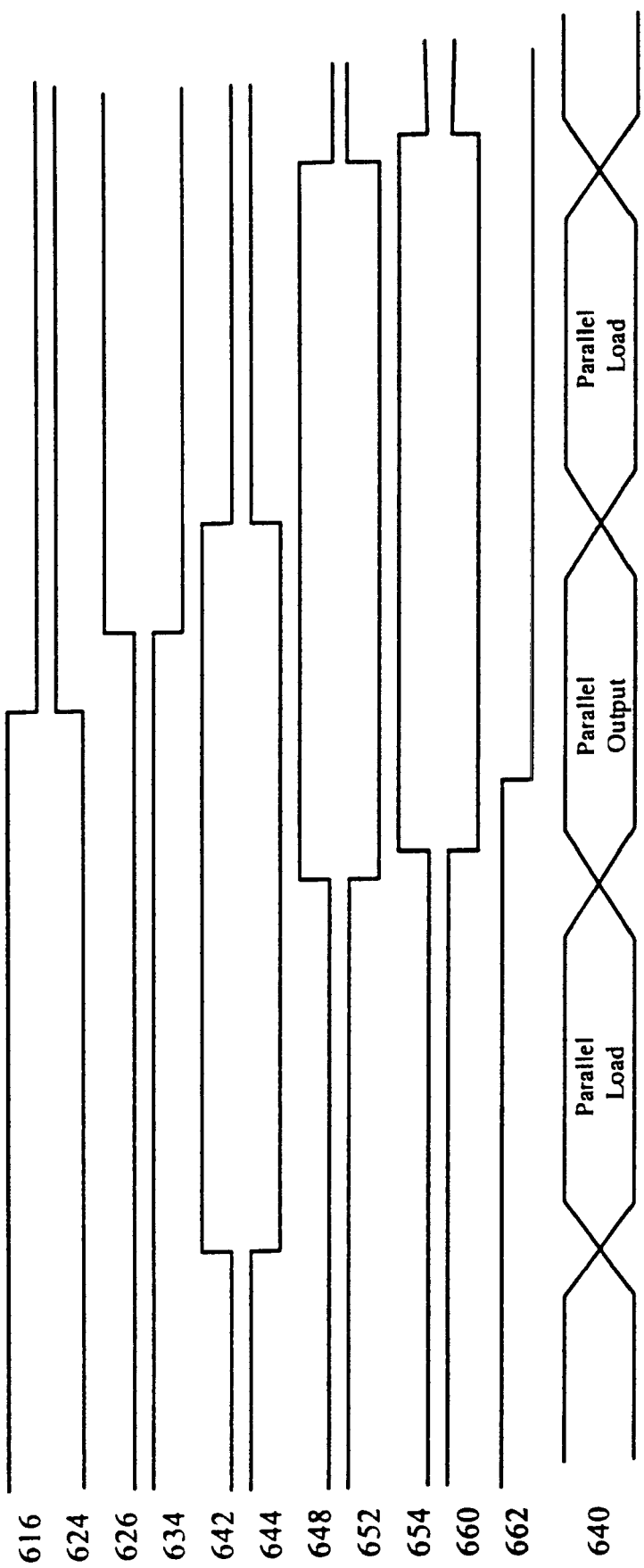
FIG. 9 illustrates another mode of operation of the register of FIG. 6.

FIG. 9 depicts operation in, or transition to, PIPO mode. Bus 640 signals a parallel load operation. Leads 642–644 transmit data from inputs 616–624 to elements 602–610, respectively. Bus 640 signals a parallel output operation. The N parallel data bits simultaneously transfer to outputs 626–634. Lead 654 transmits data output from element 602 (via lead 648) to output 626. Lead 660 transmits data output from element 610 (via lead 652) to multiplexer 614; which in turn transmits that data to output 634 via lead 662. For continued operation in PIPO mode, control bus 640 signals another parallel load and the register functions as described.

Figure 10:
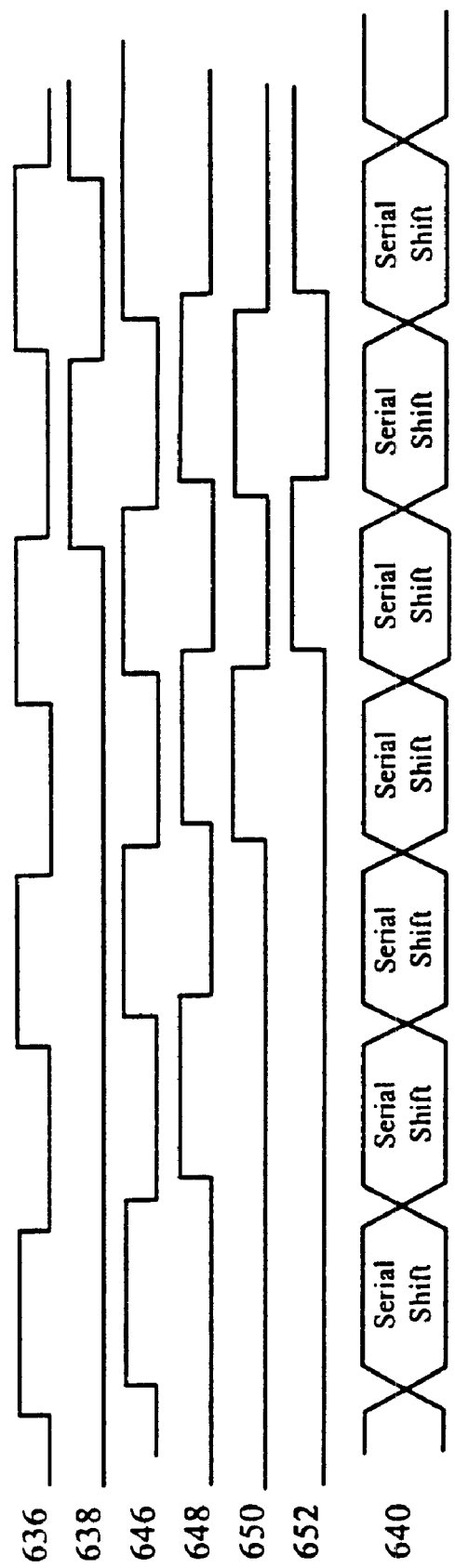
FIG. 10 illustrates another mode of operation of the register of FIG. 6.

FIG. 10 depicts operation in, or transition to, SISO mode. Bus 640 signals a serial shift operation, wherein lead 646 transfers the first serial data bit present on input 636 into element 602. Bus 640 again signals a serial shift, and storage element 602 shifts the first serial bit out to its subsequent storage element via lead 648, while transfering the next serial data bit from input 636 via lead 646. Serial data continues shifting through the data storage elements in similar fashion until the first serial data bit shifts into element 610 via lead 650. Upon the next serial shift, lead 652 transmits the first serial data bit from element 610 to output 638. As long as the register remains in SISO, serial data continually loads from input 636 and shifts through each of the storage elements as described.

Figure 11:
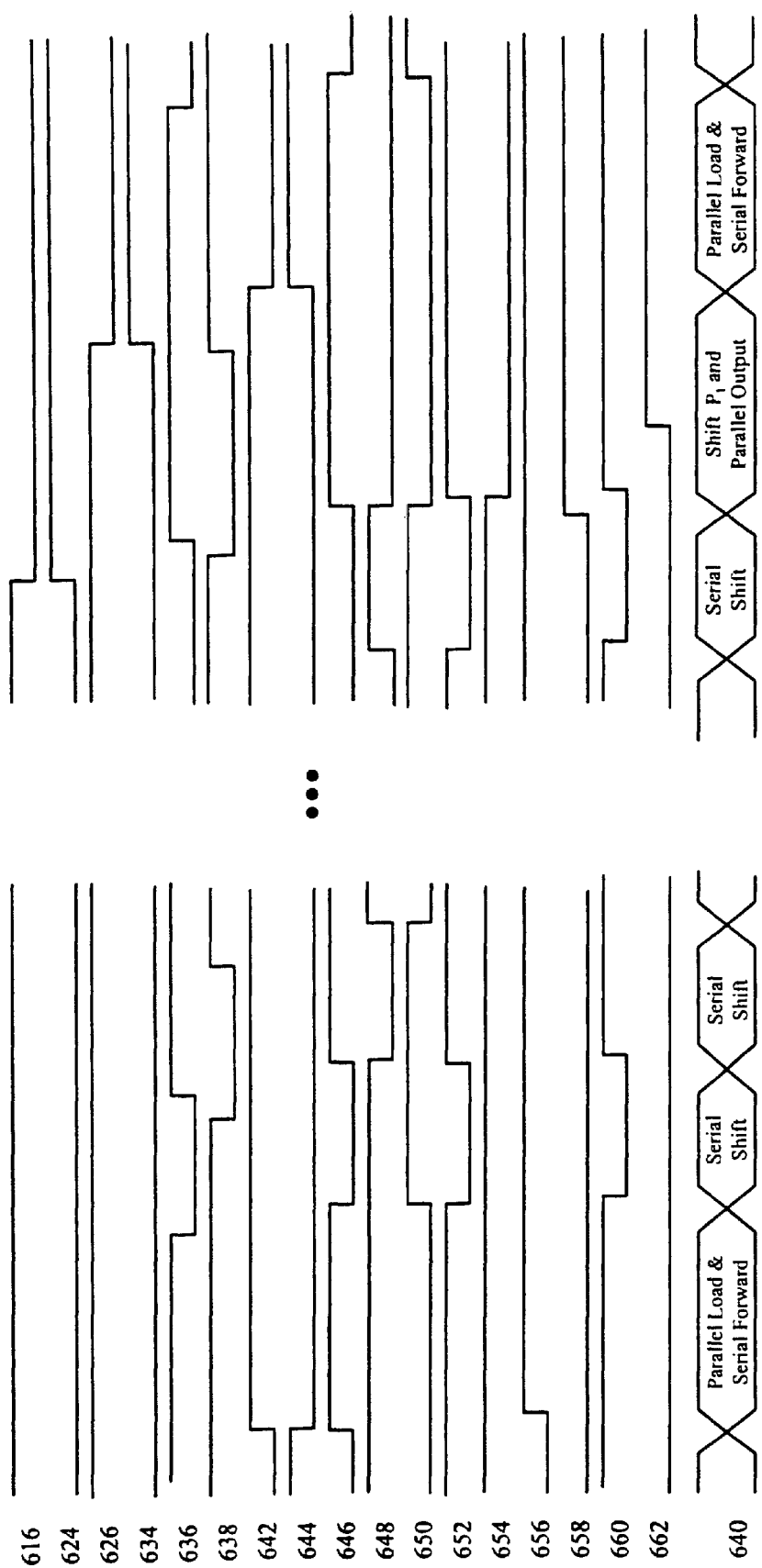
FIG. 11 illustrates another mode of operation of the register of FIG. 6.

FIG. 11 depicts operation in, or transition to, CSPIO mode. Inputs 616–624 and 636 present data as bus 640 signals a parallel load and serial forward. As the parallel load initiates, leads 642–644 forward parallel data from inputs 616–624 into elements 602 610, respectively. Concurrently the serial forward initiates, and lead 646 transmits the first serial data bit from input 636 to lead 656 which transfers that serial data bit into element 612. Bus 640 signals a serial shift wherein the N data bits previously loaded in parallel shift serially through elements 602–610 as serial data bits shift into and through each storage element following the parallel data bits. Lead 648 transfers the data from element 602 to its subsequent data storage element as lead 646 shifts the second serial bit from input 636 into element 602. Lead 650 transfers data from a preceding element to element 610 and lead 652 transmits the $N^{th}$ parallel data bit from element 610 to output 638. Operation continues in this manner until the first parallel data bit, previously loaded into element 602, shifts into element 610 via lead 650.

At this point in operation element 610 stores the first parallel data bit; element 612 stores the first serial data bit; and element 602 stores the $N^{th}$ serial data bit.

Bus 640 signals a final shift of the first parallel bit ($P_1$) concurrent with a parallel output operation. The first parallel bit shifts from element 610 to output 638 via lead 652 as lead 648 transmits the $N^{th}$ serial data bit from element 602 to output 626 via lead 654. Concurrently, lead 658 transmits the first serial data bit from element 612 to multiplexer 614; which transfers that first serial data bit to output 634 via lead 662. Assuming that register 600 remains in CSPIO mode, bus 640 again signals a parallel load and serial forward, and operation continues as previously described.

Employment of the data forwarding structure thus achieves an overlap in serial and parallel operations; providing continuous and concurrent serial to parallel and parallel to serial conversion.

Referring back to FIGS. 1 and 6, a person of ordinary skill in the art will readily recognize that the present invention enables other data conversion and transfer designs. One such possibility includes a plurality of conversion registers 100, 600 arranged in an array, enabling a port multiplexer with selectable port transfer capabilities.

The present invention provides an advancement in all digital design having transitions between serial and parallel load operations, and is entirely independent of the manner in which such digital circuitry is physically realized.

For example, the element of either FIG. 1 or FIG. 6 could be implemented as discrete circuits, a stand alone integrated circuit, or as subcircuits within an integrated circuit.

What is claimed is:

1. A device transferring serial and parallel data comprising:
   a first data storage element;
   a serial input coupled to the first data storage element;
   a first parallel input coupled to the first data storage element;
   a first parallel output coupled to the first data storage element;
   a last data storage element;
   a last parallel input coupled to the last data storage element;
   a serial output coupled to the last data storage element;
   an intermediate data storage element coupled between the first and last data storage elements wherein the first, intermediate, and last data storage elements connect serially and wherein each data storage element further includes:
   a multiplexer circuit;
   a first and a second input coupled to the multiplexer circuit, the first input coupled to a parallel input, the second input coupled to an output of a preceding data storage element, the second input of the first multiplexer circuit coupled to the serial input;
   a storage circuit coupled to the multiplexer circuit;
   an output coupled to the storage circuit and to the input of the subsequent multiplexer circuit; and
   a control input coupled to the multiplexer and storage circuits;
   a one-bit data forwarding element having an input coupled to the serial input free of an intervening data storage element;
   a mode control input coupled to the data storage elements and data forwarding element, the mode control input includes a plurality of signal lines, the control input of each data storage element and data forwarding element couples to the mode control input; and
   a last parallel output coupled to the data forwarding element free of an intervening data storage element.

2. A device transferring serial and parallel data comprising:
   a first data storage element;
   a serial input coupled to the first data storage element;
   a first parallel input coupled to the first data storage element;
   a first parallel output coupled to the first data storage element;
   a last data storage element;
   a last parallel input coupled to the last data storage element;
   a last serial output coupled to the last data storage element;
   an intermediate data storage element coupled between the first and last data storage elements wherein the first, intermediate, and last data storage elements connect serially and wherein each data storage element further includes:
   a multiplexer circuit;
   a first and a second input coupled to the multiplexer circuit, the first input coupled to a parallel input, the second input coupled to an output of a preceding data storage element, the second input of the first multiplexer circuit coupled to the serial input;
   a storage circuit coupled to the multiplexer circuit;
   an output coupled to the storage circuit and to the input of the subsequent multiplexer circuit; and
   a control input coupled to the multiplexer and storage circuits;
   a one-bit data forwarding element having an input coupled to the serial input free of an intervening data storage element;
   a one-bit data forwarding multiplexer having a first input coupled to the last data storage element and a second input coupled to the data forwarding element;
   a last parallel output coupled to the data forwarding multiplexer free of an intervening data storage element;
   a mode control input including a plurality of signal lines coupled to the data storage elements, the data forwarding element, and the data forwarding multiplexer; and
   a control input of each data storage element, data forwarding element, and data forwarding multiplexer; coupling to the mode control input.

3. A method of serial and parallel data conversion, comprising:
   loading parallel data into a series of data storage elements;
   loading concurrently serial data into a one-bit data forwarding structure free of intervening data storage element and into the series of data storage elements;
   unloading the parallel data serially from the data storage elements as serial data are concurrently shifted into the data storage elements; and
   unloading simultaneously all serial data in parallel with the last parallel output unloading from the data forwarding structure and free of an intervening data storage element as the unloading of the parallel data concludes.

* * * * *